United States Patent [19]

Rossum et al.

[11] 4,404,529

[45] Sep. 13, 1983

[54] LOWPASS FILTER WITH ELECTRONIC CONTROL OF CUTOFF AND RESONANCE

[76] Inventors: David P. Rossum, 1619 San Andreas Rd., La Selva Beach, Calif. 95076; Ronald N. Dow, 575 Remington, Apt. 16E, Sunnyvale, Calif. 95087

[21] Appl. No.: 221,299

[22] Filed: Dec. 30, 1980

[51] Int. Cl.³ ............................................. H03G 5/22
[52] U.S. Cl. .................................. 330/303; 330/257; 330/288; 330/305; 330/306
[58] Field of Search ............... 330/254, 257, 288, 302, 330/303, 305, 306; 307/520

[56] References Cited

U.S. PATENT DOCUMENTS 3,731,215  5/1973  Peil et al. ........................ 330/259 X
4,288,754  9/1981  Okada et al. .................... 330/305 X Primary Examiner—James B. Mullins
Attorney, Agent, or Firm—Freilich, Hornbaker, Wasserman, Rosen & Fernandez

[57] ABSTRACT

A lowpass filter circuit having an electronically controllable cutoff frequency and utilizing a feedback current mirror circuit as a variable impedance element. The filter circuit employs low noise, low distortion output circuitry and includes means for electronically controlling resonance.

15 Claims, 8 Drawing Figures

LOWPASS FILTER WITH ELECTRONIC CONTROL OF CUTOFF AND RESONANCE

FIELD OF THE INVENTION

This invention relates to electronic filters having an electronically controllable cutoff frequency and/or resonance value.

BACKGROUND OF THE INVENTION

A lowpass filter whose cutoff frequency is controlled by a voltage or current is useful for many signal processing applications. When the responance of the filter is similarly controllable, a completely electronically programmable lowpass filter results. This is particularly useful for computer controlled signal processing where a computer generates, via digital-to-analog converters, voltages to control the filters.

A voltage or current controlled filter for audio use should have a good signal/noise ratio and low distortion. Additionally, the filter should reject the control signal to a high degree. That is, the output of the filter should be purely the lowpass function of the input signal, and the filter should reject components of the cutoff control voltage signal. An optimum circuit should be inexpensive to produce, and would be particularly attractive if the circuit were applicable to integrated circuit technology. Finally, the resonance control of the filter should be independent of the cutoff frequency, and should provide for a stable resonance value as the cutoff frequency is swept over a wide range.

Prior art voltage and current controlled lowpass filters present several techniques, each with its own shortcomings. Problems such as poor control signal rejection, poor signal to noise ratio, requirements for AC coupling or level shifting and high component count are typical prior art disadvantages.

SUMMARY OF THE INVENTION

The present invention is directed to a low pass filter circuit, employing feedback current mirrors as dynamic resistive elements, and characterized by high accuracy, low noise, and low distortion.

A feature of the preferred embodiment of the invention involves the use of a differential circuit with transistor buffering to decode the signal passing through the dynamic element and amplify it with very low noise and distortion. A further feature of the preferred embodiment involves the use of the input resistors of the filter circuit as differential circuit load resistors for providing voltage control of filter resonance.

DESCRIPTION OF THE PREFERRED EMBODIMENT

Figure 1:
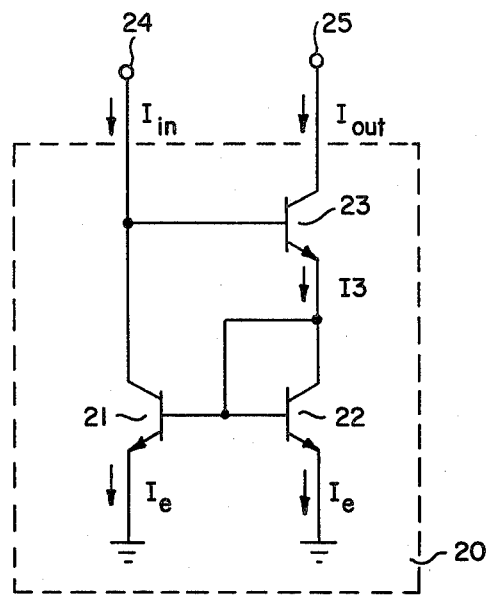
FIG. 1 shows a feedback current mirror which is a basic element of the preferred embodiment of the current invention.

The present invention is directed to a lowpass filter circuit and involves the use of a known feedback or "Wilson" current mirror circuit 20 (FIG. 1) as a dynamically variable resistive element whose input impedance $r_{in}$ is controlled by the input current $I_{in}$. The transistors 21, 22 and 23 of FIG. 1 are preferably matched for both base-emitter voltage at a given collector current and DC current gain. This can be easily accomplished by utilizing transistors of the same geometry manufactured in close proximity on the same silicon wafer.

The DC analysis of the current mirror circuit 20 will show the order of magnitude of errors in the circuit. Because transistors 21 and 22 are matched and have approximately the same base-emitter voltage, their emitter currents are substantially identical and equal to Ie. Assuming a DC current gain of B, the collector currents of transistors 21 and 22 are:

$$Ic = \frac{IeB}{B+1} \quad (1)$$

and the base currents are:

$$Ib = \frac{Ie}{B+1} \quad (2)$$

Hence the emitter current of transistor 23 is the sum of 2 base currents and one collector current:

$$I3 = \frac{2Ie}{B+1} + \frac{IeB}{B+1} = \frac{Ie(B+2)}{B+1} \quad (3)$$

The base current of transistor 23 is 1/1+B times this current. The input current to input terminal 24 is thus the sum of the base current of transistor 23 and the collector current of transistor 21:

$$Iin = \frac{Ie(B+2)}{(B+1)^2} + \frac{IeB}{B+1} = \frac{Ie(B^2+2B+2)}{(B+1)^2} \quad (4)$$

and the output current to output terminal 25 is the collector current of transistor 23:

$$Iout = \frac{Ie(B+2)}{(B+1)} \cdot \frac{B}{B+1} = \frac{Ie(B^2+2B)}{(B+1)^2} \quad (5)$$

The ratio of Iin to Iout is thus:

$$Iin/Iout = \frac{B^2+2B+2}{B^2+2B} \quad (6)$$

which shows that the error from input to output is only 2 parts in ($B^2+2B$). Thus for values of current gain B greater than 100, typical for modern transistors, the error from input to output is less than 0.02%.

The impedance $r_{in}$ at the input node 24 of current mirror circuit 20 has a value $dV/dI$, and can be determined from the transistor equation:

$$Vbe = \left(\frac{KT}{q}\right) \ln\left(\frac{Ie}{Is}\right) \quad (7)$$

Where
- Vbe is the transistor base-emitter voltage
- Ie is the transistor emitter current
- K is Boltzmann's constant
- q is the charge on the electron
- T is the absolute temperature and
- Is is a characteristic current determined by the geometry, doping and temperature of the transistor.

As transistors 22 and 23 of the feedback current mirror in FIG. 1 are operating at nominally the same collector current, which is approximately equal to Iin, and the voltage at the input node 24 is the sum of the base-emitter voltage of transistor 22 and the base-emitter voltage of transistor 23 which are approximately equal then $$Vin = \left(\frac{2KT}{q}\right) \ln\left(\frac{Iin}{Is}\right) \quad (8)$$

Differentiating:

$$dVin/dIin = r_{in} = \frac{2KT}{q} \cdot \frac{1}{Iin} \quad (9)$$

At room temperature, KT/q is valued at approximately 26 millivolts. Thus, the input impedance $r_{in}$ to the current mirror circuit 20 has a value of 52 ohms at $I_{in}=1$ milliamps and is inversely proportional to $I_{in}$ about this point. Hence the feedback current mirror circuit 20 is a current controlled impedance.

Figure 2:
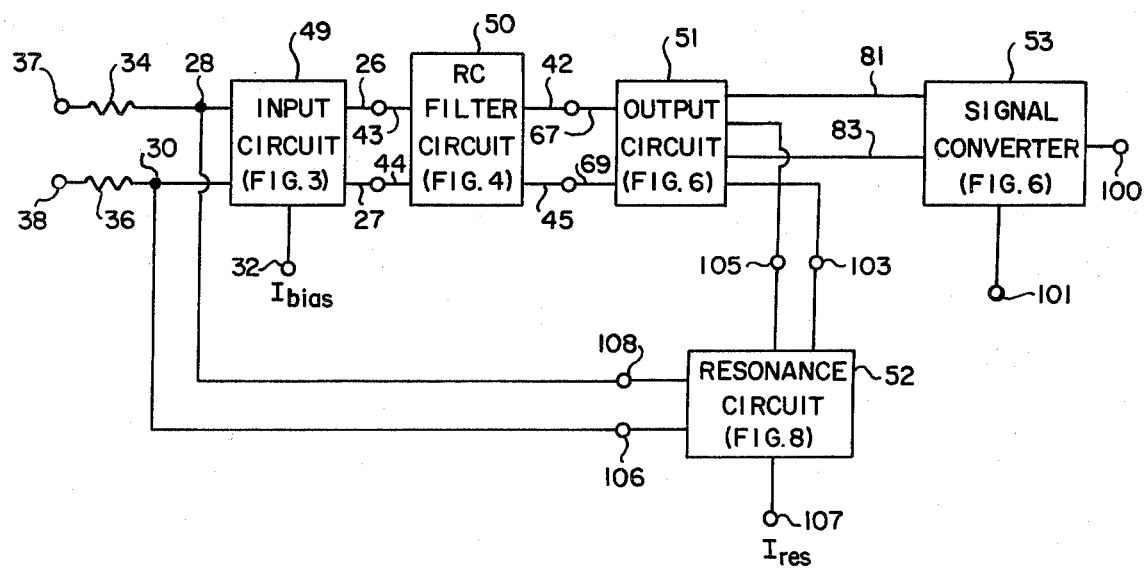
FIG. 2 shows a block diagram of a multi stage RC filter embodying the present invention.

A block diagram of a multi stage filter in accordance with the present invention is shown in FIG. 2. The filter includes an input circuit 49 for producing output currents at terminals 26, 27 which are a function of a bias current applied to terminal 32 and the voltage differential between input signals applied to input terminals 37, 38. The input circuit 49 is depicted in detail in FIG. 3 to be described hereinafter.

The signals produced at terminals 26,27 are coupled to the input terminals 43,44 of an RC filter stage 50 which comprises current mirrors as the variable resistive elements thereof. The filter stage is depicted in detail in FIGS. 4 and 5. The differential filtered output signal appears at filter output terminals 42,45.

Figure 6:
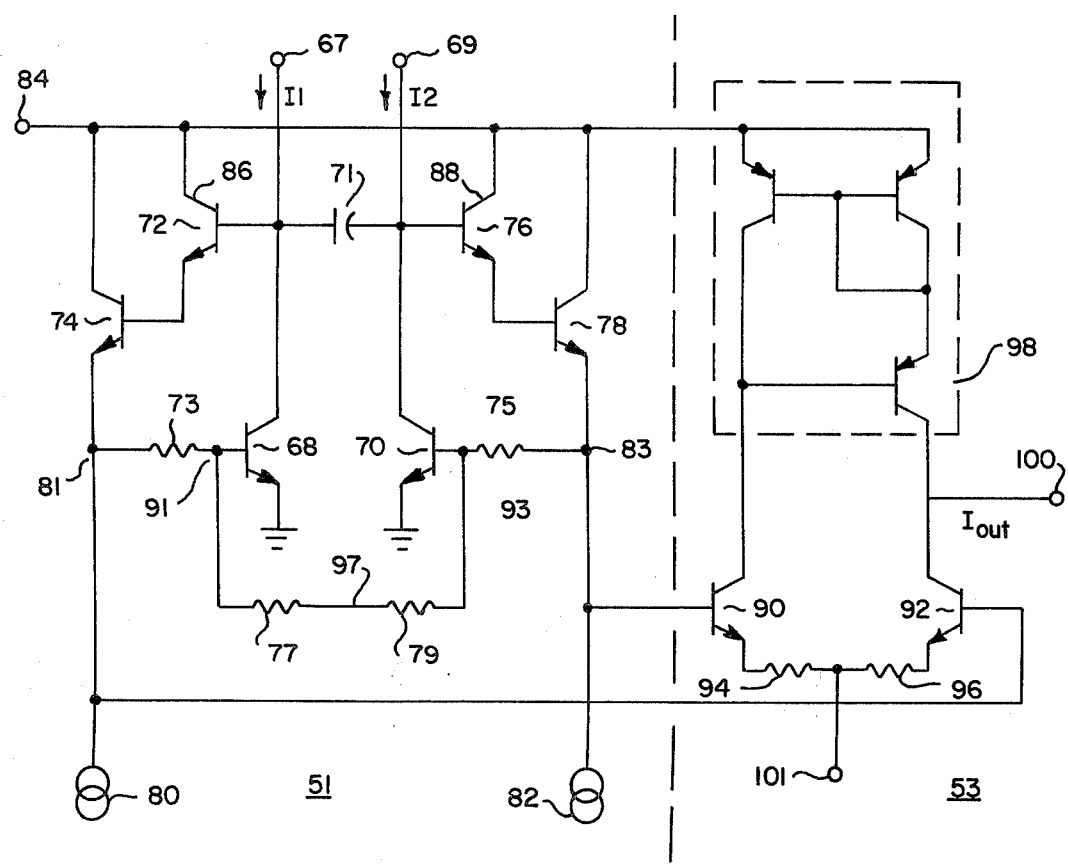
FIG. 6 shows a low distortion output circuit used in the preferred embodiment.
Figure 7:
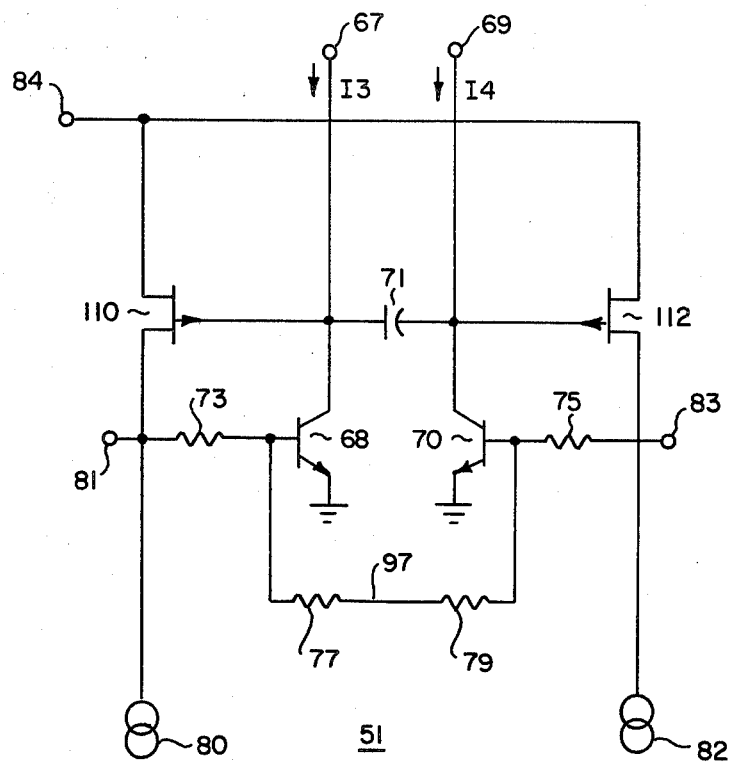
FIG. 7 shows another embodiment of the output stage of FIG. 6 wherein field effect transistor buffers replace the darlington buffers of FIG. 6.
Figure 8:
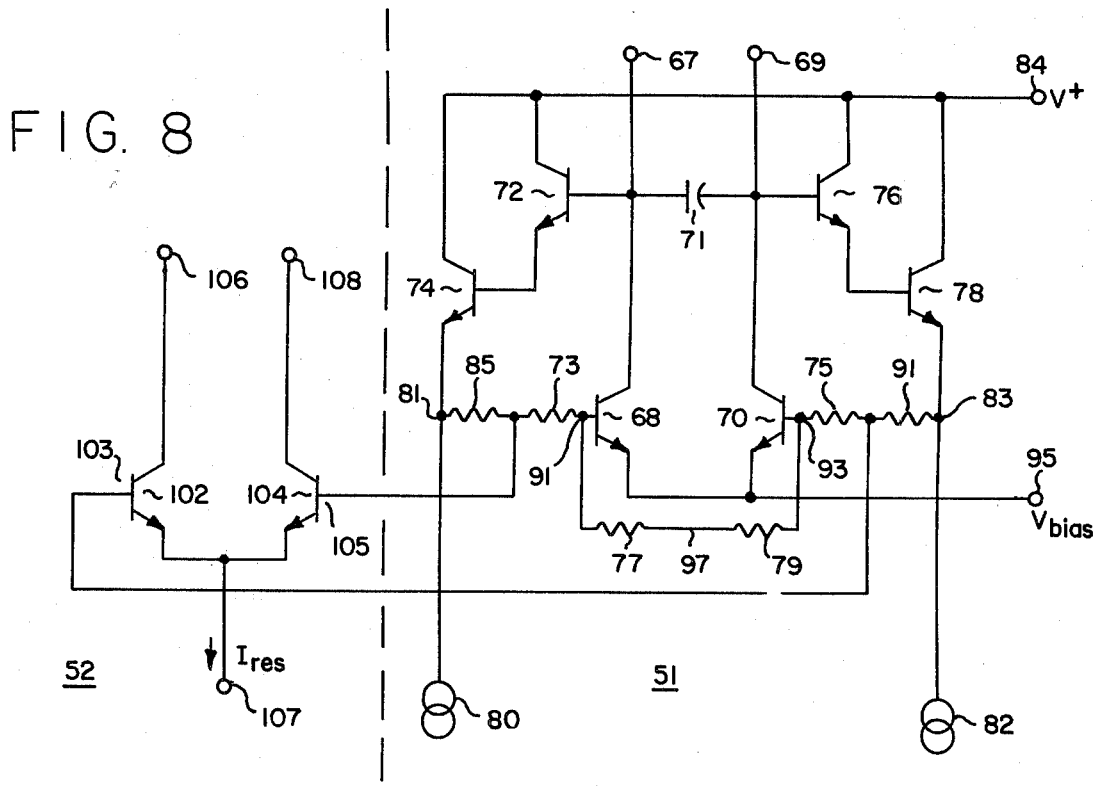
FIG. 8 shows the output stage of FIG. 6 with the addition of a simple current controlled resonance circuit that is yet another element of the present invention.

The output of the filter stage 50 is coupled to the input terminals 67,69 of the output stage 51, embodiments of which are illustrated in detail in FIGS. 6,7, and 8. The output stage provides further filtering and decoding of the filtered signal and provides both an output differential voltage at terminals 81 and 83 as shown in detail in FIGS. 6,7, and 8, but also provides a signal to the resonance control circuit 52 from terminals 103,105 as shown in detail in FIG. 8.

The resonance control circuit 52 provides a signal for determining the resonance value of the filter as the current controlled impedance of the filter is varied. The circuit receives a signal from the output circuit 51 at terminals 103,105 which it superimposes upon a resonance control current received at terminal 107. This composite signal appears at resonance control output terminals 106,108 and is fed to the bases 28,30 of input transistors 29,31 in the input circuit 49 thereby providing a feedback loop with a resonance control signal added to the feedback signal.

The differential to single ended signal converter 53 receives the output stage 51 output signal at terminals 81,83. These equal but opposite phase differential signals are converted to a single ended output current which appears at terminal 100.

The functions of each of the aforementioned stages will now be explained in detail.

Figure 3:
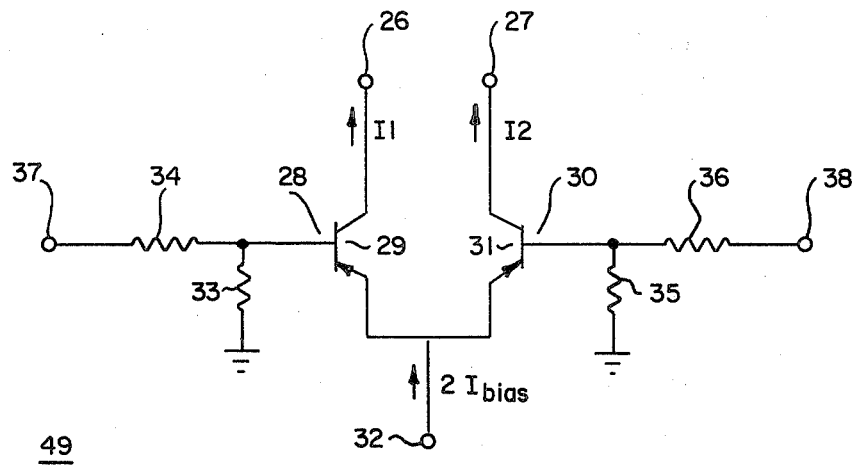
FIG. 3 shows a differential transistor pair with input resistors used to superimpose the bias and signal currents as required by the preferred embodiment of the present invention.

A circuit 49 for producing the differential input signal to the filter stage 50 is depicted in FIG. 3. The output currents I1 and I2 at terminals 26 and 27 are the familiar differential pair currents.

$$I1 = \frac{2Ibias}{1 + e^{qVsig/KT}} \quad (10)$$

$$I2 = \frac{2Ibias}{1 + e^{-qVsig/KT}} \quad (11)$$

where Vsig is the differential voltage from the base 28 of transistor 29 to the base 30 of transistor 31.

For the small signals used when the transistors are in the linear region, which are also necessary for the operation of the filter circuit itself, approximations $1/(1+x)$ is approximately equal to $1-x$, and $e^x$ is approximately $1+x$ can be used to obtain:

$$I1 = Ibias - \frac{qVsig}{2KT} \quad (12)$$

$$I2 = Ibias + \frac{qVsig}{2KT} \quad (13)$$

thus providing the differential signal with bias current as required for the operation of the filter circuit 50. Ibias can be supplied by any appropriate variable current source to terminal 32. Resistors 33,34,35 and 36 can be chosen to accommodate any single-ended or differential voltage signal level at input terminals 37 and 38.

Figure 4:
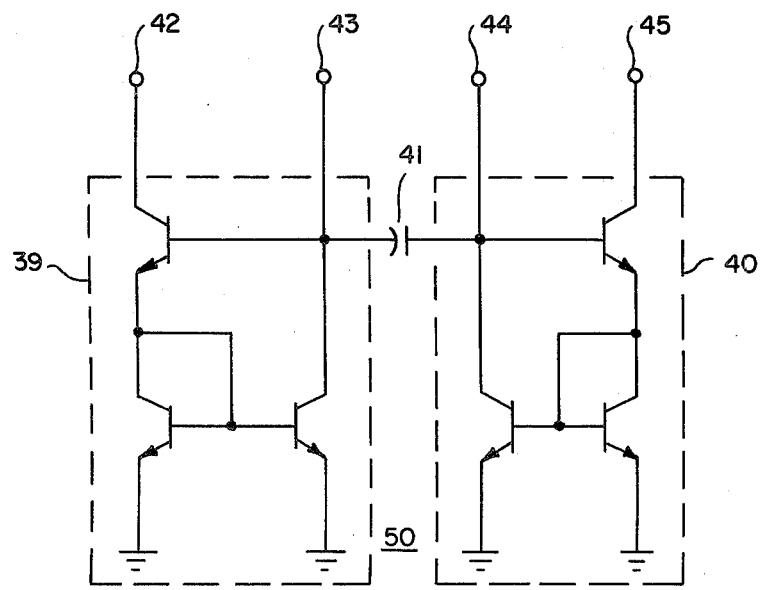
FIG. 4 shows the preferred embodiment of a lowpass filter stage in accordance with the present invention.

FIG. 4 shows a single lowpass current controlled filter circuit 50 in accordance with the present invention. The circuit is comprised of two capacitively coupled current mirror circuits 39 and 40 having input terminals 43 and 44 for receiving the composite output signal at terminals 26 and 27 of the input circuit 49. The filter circuit 50 is best analyzed by referring to the equivalent circuit of FIG. 5 which is electrically identical to that of FIG. 4. The only change is the substitution of two series capacitors 46 and 47 of value 2C for capacitor 41 of value C in FIG. 4. The junction 48 of capacitors 46 and 47 contains no signal component because the signal is differential, hence equal and opposite, at the other ends of both capacitors, input nodes 43 and 44. Hence junction 48 is at AC ground. This simplifies the analysis of the filter into that of a single RC filter with capacitor value 2C, and the time constant at room temperature is thus (from equation 9):

$$T = \frac{104C}{Ibias} \quad (14)$$

where I is in mA, and C in Farads. The cutoff frequency will hence be:

$$Fc = \frac{Ibias}{653C} \tag{15}$$

where Fc is in Hz, I is in mA, and C in Farads.

As can be seen, the output terminals 42 and 45 present a differential current ready to be cascaded into the next current mirror pair. Cascaded filter stages will, of course, alternate between mirrors composed of NPN and PNP transistors. Any of the stages can easily be converted to an equivalent circuit by changing NPN transistors to PNP or vice versa and reversing the polarities of the appropriate power supplies and currents. Because of the high accuracy of feedback current mirrors, the bias current can be swept over a wide range with no input to output current tracking errors resulting. This gives superior control rejection over other methods.

Converting the differential output current into a single-ended output voltage or current is a more difficult and critical task. Gain must be provided, and a good signal/noise ratio must be maintained. If the output circuit can have a transfer characteristic that is substantially the inverse of the differential input pair, the minimum distortion will result in the critical case when the filter is passing signal without filtering significant components.

The output circuit 51 of FIG. 6 provides such an amplifier, and can act as an additional filter stage as well. The circuit employs feedback to force the bases of transistors 68 and 70 to the signal levels. The Darlington transistors 72,74 and 76, 78 with current sources 80 and 82 act as low input current unity gain buffers. Terminal 84 provides a positive power supply for the darlington collectors 86 and 88.

A second embodiment of the output amplifier is shown in FIG. 7 wherein field effect transistors 110,112 replace Darlington transistors 72,74 and 76,78. The field effect transistors provide somewhat improved performance in the buffer stages, but only at the expense of a substantial increase in expense and added difficulty in integrating the circuit on a single chip. Therefore, the Darlington configuration of FIG. 6 is the preferred embodiment.

Assuming the case when the filter has not significantly changed the signal, the currents I3,I4 at the collectors 67 and 69 of transistors 68 and 70 will be the substantial equivalent of the signal components of I1 and I2 from FIG. 3 respectively, as represented in the above equations 10 and 11. Assuming that feedback is in effect, the differential base voltage between points 91 (Vb1) and 93 (Vb2) must be:

$$Vb1 - Vb2 = \frac{KT}{q} \ln \frac{I1}{I2} \tag{16}$$

substituting using equations 10 and 11 and simplifying:

$$Vb1 - Vb2 = Vsig \tag{17}$$

This is an exact relationship. Hence the output circuit results in no distortion, as no small signal approximation is necessary.

The output stage 51 has gain. Since the junction 97 of resistors 77,79 is at AC ground, due to the differential nature of the signal, the differential signal at the emitters 81 and 83 of transistors 74 and 78 will be R73/R77 and R75/R79 times Vsig (where R indicates the appropriate resistor). This can then be converted by signal converter 53 to a signal ended current Iout at output terminal 100 by a conventional degenerated differential amplifier such as that shown comprised of transistors 90,92, resistors 94, 96 and current mirror 98. Values for resistors 94 and 96 and the bias current applied to terminal 101 can be selected for a convenient peak to peak value of Iout.

Figure 5:
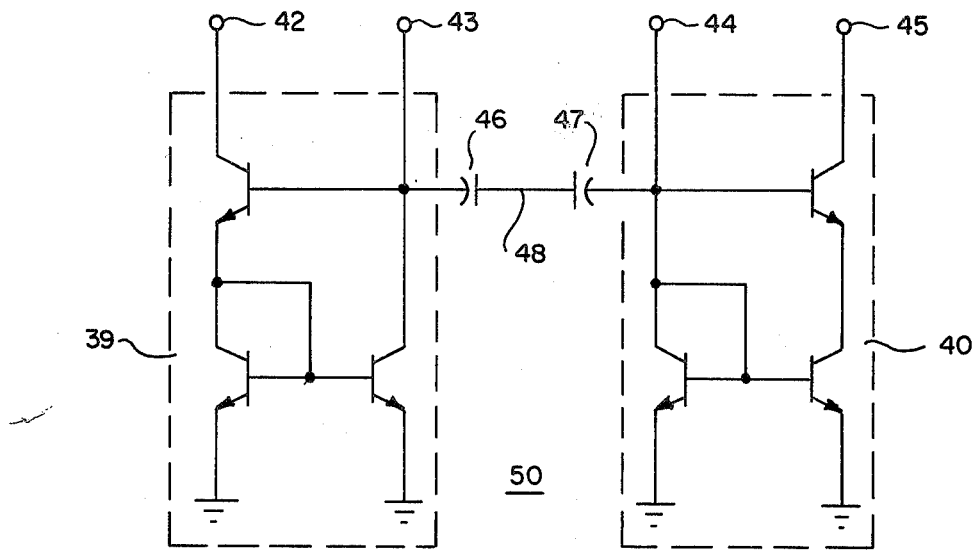
FIG. 5 shows an electrical equivalent of the embodiment of FIG. 4 that simplifies analysis.

In addition, the output stage itself can act as an additional filter stage. For a small change in I1:

$$\frac{dVb1}{dI1} = \frac{KT}{qI1} \tag{18}$$

similar to that for a single transistor in the current mirror. However, the change in voltage at input node 67 is amplified by a factor of R73/R77, hence the impedance at node 67 at room temperature is:

$$Rin = \frac{26R73}{(R77)(Ibias)} \tag{19}$$

and hence the filter cutoff frequency, by an analysis similar to that for the feedback current mirror filter of FIGS. 4 and 5 is:

$$Fc = \frac{(Ibias)(R77)}{(327C)(R73)} \tag{20}$$

where C is the value of capacitor 71 in Farads, Ibias is in milliamps, and Fc is in Hertz.

The fact that the output stage 51 can operate as a lowpass filter improves the system signal to noise ratio substantially in many applications. If the output filter cutoff frequency is chosen as the lowest cutoff frequency in the filter system, the stage will introduce little noise in the stopband as the amplifier gain will be low at these frequencies. This feature is very useful in audio filtering applications.

It is particularly attractive in electronic musical instruments to produce a four stage lowpass filter with negative feedback. Each of the single lowpass RC stages produces a lowpass pole having a 6 db/octave cutoff asymptote, 45 degrees of phase shift and 3 db of attenuation at the cutoff frequency. This produces a total rolloff of 24 db/octave for the four poles in series, sharp enough to produce an audibly pleasing effect. The phase shift at cutoff is 180 degrees. Hence, when negative feedback is applied, this phase shift inverts the sense of the feedback to positive, producing resonance at the cutoff frequency. The extent of negative feedback, and hence the degree of resonance, is controlled by a variable current.

The revised output circuit 51 of FIG. 8 shows the interconnection with current controlled resonance circuit 52 in accordance with the present invention. As can be seen, the resonance circuit comprises, transistors 102 and 104, and output circuit 51 is modified to include resistors 85 and 91 and means for shifting of the bias voltage at the emitters 95 of transistors 68 and 70. The bias voltage at terminal 95 should be negative enough to insure that the bases 91 and 93 of transistors 68 and 70 do not rise above ground potential for any signal output level.

Transistors 102 and 104 act as a simple current controlled amplifier, feeding the output signal back to the input transistors 29 and 31. This is accomplished by connecting collectors 106 and 108 of transistors 102 and 104 to the bases 30 and 28 of transistors 31, 29 of FIG. 3. The feedback signal is directly proportional to the resonance control current (Ires) applied to terminal 107. The scaling of Ires will be determined by the values chosen for resistors 33 and 35 of FIG. 3.

It should now be apparent that a novel variable frequency RC filter and circuit for controlling resonance therein has been disclosed. Although the particular embodiments of the invention have been described and illustrated herein, it is recognized that modifications and variations may readily occur to those skilled in the art. The claims herein are intended to encompass all such embodiments.

What is claimed is:

1. An electronic filter circuit, comprising:
    a first stage having an input and a differential output for superimposing an input signal upon a bias signal to produce a first differential composite signal current at the output thereof;
    a second stage having a differential input connected to said output of said first stage, an output and means connected to said input and said output for producing a second stage differential output current of substantially opposite polarity to the current at the input thereof;
    said second stage having a variable input impedance associated therewith, the value of which is functionally related to the magnitude of said bias signal;
    said second stage having a cutoff frequency associated therewith, the value of which is functionally related to the value of said input impedance; and
    a third stage having first and second differential input terminals and first and second differential output terminals for receiving said second stage differential output current at said input terminals and for converting said current to a differential voltage at said first and second output terminals thereof.

2. The filter of claim 1 wherein said second stage comprises one or more pairs of current controlled variable resistances each having first and second differential input terminals and first and second differential output terminals associated therewith and capacitance coupling between the two input terminals of each pair.

3. The filter of claim 2 wherein each of said current controlled variable resistances is a feedback current mirror circuit.

4. The filter of claim 1 wherein said third stage comprises:
    first and second transistors, each having a base, an emitter and a collector, said collector of said first transistor connected to said third stage first input terminal and said collector of said second transistor connected to said third stage second input terminal;
    first and second buffers, said first buffer having an input connected to said third stage first input terminal, said second buffer having an input connected to said third stage second input terminal, said first buffer having an output coupled to said base of said first transistor and to said third stage first output terminal and said second buffer having an output coupled to said second transistor base and to said third stage second output.

5. The filter of claim 4 wherein said third stage further includes capacitance coupling between said third stage first and second input terminals.

6. The filter of claim 4 wherein each of said buffers comprises a darlington configured transistor amplifier.

7. The filter of claim 4 wherein each of said buffers comprises a field effect transistor.

8. The filter of claim 1, further comprising a fourth stage for converting said differential third stage output voltage to a single ended output current comprising a differential amplifier having first and second input terminals and first and second output terminals, said first input terminal connected to said third stage first output terminal, said second input terminal connected to said third stage second output terminal, said first output terminal connected to the output terminal of a feedback current mirror circuit and said second output terminal connected to the input terminal of said feedback current mirror circuit and a fourth stage output terminal also connected to said feedback current mirror output terminal.

9. In a multistage RC filter having input and output stages and a variable cutoff frequency associated therewith and first and second differential input terminals and first and second differential output terminals, means for establishing a current controlled variable resonance value therein, comprising:
    first and second transistors, each having an emitter, a base and a collector;
    a variable bias current source connected to the emitters of said first and second transistors;
    means for connecting said first transistor base to said first differential output terminal and said second transistor base to said second differential output terminal; and
    means for connecting said first transistor collector to said first differential input terminal and said second transistor collector to said second differential input terminal.

10. An RC filter circuit having a variable cutoff frequency determined by the resistance and capacitance values associated therewith, comprising:
    input circuit means having a bias current terminal and a pair of signal input terminals and responsive to a differential input signal applied to said signal input terminals and a bias current supplied to said bias current terminal for producing a differential output signal as a function of said input signal and said bias current;
    at least one filter stage having first and second input terminals and first and second output terminals;
    means for applying said differential output signal produced by said input circuit means to said filter stage first and second input terminals;
    said filter stage including first and second current controlled circuit means respectively connected between said filter stage first input terminal and first output terminal and between said filter stage second input terminal and second output terminal, each for defining an input resistance $r_{in}$ controlled by an input current $I_{in}$ supplied thereto, said circuit means producing an output signal at said filter stage output terminals opposite in polarity to the signal applied to said filter stage input terminals; and
    capacitance means interconnecting said filter stage first and second input terminals.

11. The filter circuit of claim 10 including multiple filter stages connected in cascade.

12. The filter circuit of claim 10 wherein each of said current controlled circuit means comprises a current mirror circuit.

13. The filter circuit of claim 10 further including feedback means for coupling said filter stage output terminals to said input circuit means input terminals, said feedback means including means responsive to a resonance control signal for determining the resonance value of said filter circuit.

14. The filter circuit of claim 10 wherein each of said current controlled circuit means comprises:

first, second and third transistors each having an emitter, a base and a collector;

means connecting one of said filter stage input terminals to the collector of said first transistor and to the base of said third transistor;

means connecting one of said filter stage output terminals to the collector of said third transistor;

means connecting the emitter of said third transistor to the bases of said first and second transistors and to the collector of said second transistor; and means applying a reference potential to the emitters of said first and second transistors.

15. The filter circuit of claim 14 wherein said first, second, and third transistors are matched for substantially identical base-emitter voltage at a given collector current and for substantially identical DC current gain.

* * * * *